United States Patent
Kim

(10) Patent No.: US 9,536,576 B2
(45) Date of Patent: Jan. 3, 2017

(54) SEMICONDUCTOR DEVICE WITH A SENSE AMPLIFIER UNIT RESPONSIVE TO A VOLTAGE CHANGE OF INPUT SIGNALS AND A SENSE CONTROL SIGNAL

(75) Inventor: Hyung Soo Kim, Gyeonggi-do (KR)

(73) Assignee: SK Hynix Inc., Icheon-si (KR)

( * ) Notice: Subject to any disclaimer, the term of this patent is extended or adjusted under 35 U.S.C. 154(b) by 41 days.

(21) Appl. No.: 13/604,472

(22) Filed: Sep. 5, 2012

(65) Prior Publication Data

US 2013/0294185 A1    Nov. 7, 2013

(30) Foreign Application Priority Data

May 7, 2012  (KR) .................. 10-2012-0048125

(51) Int. Cl.
*G11C 7/08* (2006.01)
*G11C 7/06* (2006.01)
*G11C 11/4091* (2006.01)

(52) U.S. Cl.
CPC .............. *G11C 7/06* (2013.01); *G11C 7/065* (2013.01); *G11C 11/4091* (2013.01)

(58) Field of Classification Search
CPC ............. G11C 7/062; G11C 7/08; G11C 7/06; G11C 7/1069; G11C 11/4091
USPC ............... 365/190, 205, 208, 207, 196, 195, 365/189.15, 193, 194
See application file for complete search history.

(56) References Cited

U.S. PATENT DOCUMENTS

| 7,952,947 B2* | 5/2011 | Kang ............................ 365/205 |
| 8,310,891 B2* | 11/2012 | Kim et al. .................... 365/203 |
| 2009/0251981 A1* | 10/2009 | Huang et al. ................. 365/205 |
| 2011/0158010 A1* | 6/2011 | Lee .............................. 365/194 |

FOREIGN PATENT DOCUMENTS

| KR | 10-2006-0132249 A | 12/2006 |
| KR | 10-2007-0091451 A | 9/2007 |

OTHER PUBLICATIONS

English Translation of KR-10-2007-0091451 published Sep. 11, 2007.*

* cited by examiner

*Primary Examiner* — Andrew Q Tran
(74) *Attorney, Agent, or Firm* — William Park & Associates Ltd.

(57) ABSTRACT

A sense amplifier circuit includes an enable signal generation unit configured to generate an enable signal when a change in a voltage level of input signals is sensed; a sink unit configured to provide a sense voltage in response to the enable signal; and a sense unit configured to generate an output signal in response to the sense voltage and the input signals.

5 Claims, 4 Drawing Sheets

SEMICONDUCTOR DEVICE WITH A SENSE AMPLIFIER UNIT RESPONSIVE TO A VOLTAGE CHANGE OF INPUT SIGNALS AND A SENSE CONTROL SIGNAL

CROSS-REFERENCES TO RELATED APPLICATION

The present application claims priority under 35 U.S.C. §119(a) to Korean application number 10-2012-0048125, filed on May 7, 2012, in the Korean Intellectual Property Office, which is incorporated herein by reference in its entirety.

BACKGROUND

1. Technical Field

The present invention generally relates to a semiconductor device, to a sense amplifier circuit, and a semiconductor device using the same.

2. Related Art

A semiconductor device is driven by for power and thus is configured to include a sense amplifier circuit for sensing a difference in the voltage level and for converting the difference into a digital level. A sense amplifier circuit may sense a difference between the voltage levels of input signals. An input signal having a relatively high voltage level according to a result of the sensing is amplified in a high level and outputted, and an input signal having a relatively low voltage level according to a result of the sensing is amplified in a low level and outputted. A sense amplifier circuit using another method amplifies an input signal, having a relatively low voltage level, into a signal of a low level so that the input signal having a relatively low voltage level is clearly distinguished from an input signal having a relatively high voltage level.

FIG. 1 is a diagram illustrating the construction of a known sense amplifier circuit. Referring to FIG. 1, the sense amplifier circuit 10 includes first to fifth transistors N1, N2, N3, N4, and N5, respectively. The left side of the sense amplifier circuit 10 corresponds to an input terminal, and the right side thereof corresponds to an output terminal. The first transistor N1 is turned on in response to a sense control signal EN when a signal is transmitted from the input terminal to the output terminal, thus supplying a ground voltage VSS. The degree of turn-on of the second and the third transistors N2 and N3 varies according to the levels of input signals IN and INB when a signal is transmitted from the input terminal to the output terminal. Accordingly, the first to third transistors N1, N2, and N3, respectively, may generate output signals OUT and OUTB by amplifying the input signals IN and INB. The fourth and the fifth transistors N4 and N5 are turned off when a signal is transmitted from the input terminal to the output terminal, but are turned on in response to a control signal WE when a signal is transmitted from the output terminal to the input terminal. When the fourth and the fifth transistors N4 and N5 are turned on, they couple the input terminal and the output terminal.

The operation of the sense amplifier circuit 10 when a signal is transmitted from the input terminal to the output terminal is as follows. When the input signal IN has a higher level than the input signal INB, the degree of turn-on of the second transistor N2 is greater than the degree of turn-on of the third transistor N3. Accordingly, the output terminal OUTB drops to a ground voltage (VSS) level faster than the output terminal OUT. When the output signal OUTB reaches the ground voltage (VSS) level, a difference in the voltage level of the input signals IN and INB is amplified and thus the amplified output signals OUT and OUTB may be outputted through the output terminal.

The sense amplifier circuit 10 starts a sense amplification operation when the sense control signal EN is enabled. The sense control signal EN turns on the first transistor N1 that supplies the ground voltage VSS, Accordingly, a point in time at which the sense control signal EN is enabled is closely related to a precise operation of the sense amplifier circuit 10. For example, if the input signals IN and INB are not supplied at normal points in time, the levels of the output signals OUT and OUTB may be reversed or points in time at which the output signals OUT and OUTB are generated may be delayed.

Furthermore, even when a mismatch occurs between the second and the third transistors N2 and N3, respectively, which substantially perform a sense operation, the output signals OUT and OUTB may not be normally generated.

SUMMARY

Described herein is a sense amplifier circuit for generating output signals stably by sensing and amplifying input signals precisely and a semiconductor device for using the same.

In an embodiment, a sense amplifier circuit includes an enable signal generation unit configured to generate an enable signal when a change in a voltage level of input signals is sensed; a sink unit configured to provide a sense voltage in response to the enable signal; and a sense unit configured to generate an output signal in response to the sense voltage and the input signals.

In an embodiment, a sense amplifier circuit includes an enable signal generation unit configured to generate an enable signal from a sense control signal in response to input signals; a sink unit configured to supply a sense voltage in response to the enable signal; and a sense unit configured to generate output signals in response to the sense voltage and the input signals.

In an embodiment, a semiconductor device includes first data I/O lines configured to transmit input signals; a sense amplifier unit configured to be enabled when a change in a voltage level of the input signals is sensed and configured to generate output signals by amplifying the input signals; and second data I/O lines configured to transmit the output signals. In an embodiment, a semiconductor device includes a bit line sense amplifier configured to amplify data of a memory cell; a column switch configured to transmit the amplified data to first data I/O lines in response to a column select signal; and a sense amplifier unit configured to be enabled when a voltage level of the first data I/O lines is changed by the transmitted data and configured to generate output signals by amplifying the transmitted data and output the output signals to second data I/O lines when the sense amplifier unit is enabled.

BRIEF DESCRIPTION OF THE DRAWINGS

Features, aspects, and embodiments are described in conjunction with the attached drawings, in which.

DETAILED DESCRIPTION

Hereinafter, a sense amplifier circuit and a semiconductor device using the same according to various embodiments will be described below with reference to the accompanying drawings.

Figure 1:
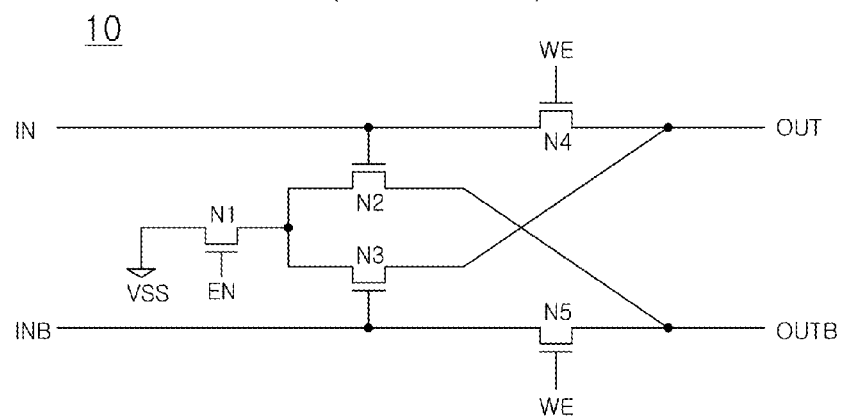
FIG. 1 is a diagram illustrating the construction of a known sense amplifier circuit.
Figure 2:
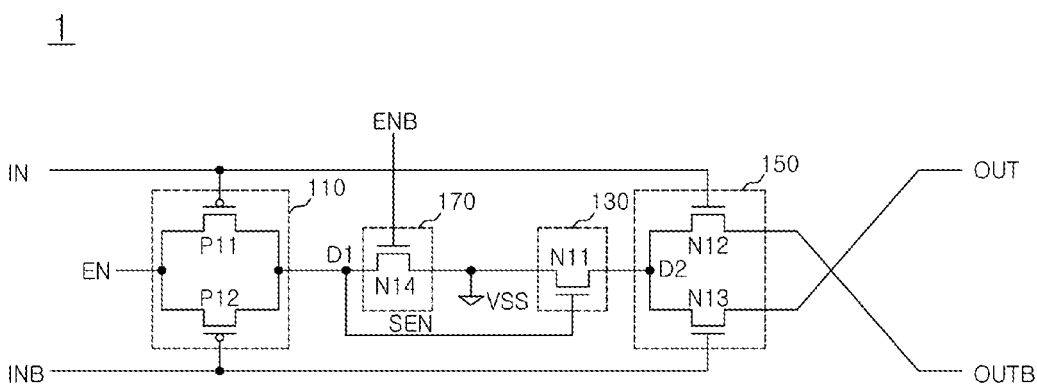
FIG. 2 is a diagram illustrating a construction of a sense amplifier circuit in accordance with an embodiment.

FIG. 2 is a diagram illustrating a construction of a sense amplifier circuit in accordance with an embodiment. The sense amplifier circuit 1 in accordance with an embodiment may be enabled in response to received input signals IN and INB. The sense amplifier circuit 1 may sense a change in the level of the input signals IN and INB and may perform a sense amplification operation according to a result of the sensing. Referring to FIG. 2, the sense amplifier circuit 1 may include an enable signal generation unit 110, a sink unit 130, and a sense unit 150.

The enable signal generation unit 110 may receive the input signals IN and INB, may sense a change in the level of the input signals IN and INB, and may generate an enable signal SEN according to a result of the sensing. The enable signal generation unit 110 may receive a sense control signal EN. When a change in the level of the input signals IN and INB is sensed, the enable signal generation unit 110 may supply the sense control signal EN as the enable signal SEN. For example, when the input signals IN and INB shift from a high level to a low level, the enable signal generation unit 110 may generate the enable signal SEN from the sense control signal EN. The sense control signal EN may be used to operate the sense amplifier circuit 1. If a change in the level of the input signals IN and INB is not sensed although the sense control signal EN is received, the enable signal generation unit 110 does not generate the enable signal SEN. Accordingly, although the sense control signal EN is received, the sense amplifier circuit 1 does not start a sense amplification operation. When a change in the level of the input signals IN and INB is sensed, the sense amplifier circuit 1 can start the sense amplification operation.

As illustrated in FIG. 2, the input signals IN and INB can be a pair of signals. The pair of input signals IN and INB can be supplied with differential signals. The input signals IN and INB may be precharged into a first level, and then the levels of the input signals IN and INB can be changed. For example, when a signal of a first level is supplied to the sense amplifier circuit 1, the input signal IN can maintain the first level and the input signal INB can shift to a second level. In contrast, when a signal of a second level is supplied to the sense amplifier circuit 1, the input signal IN can shift to the second level and the input signal INB can maintain a first level. In the detailed description, the second level refers to a voltage logic level opposite to the first level. For example, the first level can be a high voltage logic level, and the second level can be a low voltage logic level. The enable signal generation unit 110 can sense a signal of the low level and generate the enable signal SEN from the sense control signal EN.

The sink unit 130 may supply a sense voltage in response to the enable signal SEN. The sink unit 130 may supply the sense voltage when the enable signal SEN is enabled, but does not supply the sense voltage when the enable signal SEN is disabled. In an embodiment, the sense voltage is illustrated as being a ground voltage VSS.

The sense unit 150 may receive the sense voltage and the input signals IN and INB and may generate output signals OUT and OUTB. When the sense voltage is received, the sense unit 150 may sense the levels of the input signals IN and INB and may generate the output signals OUT and OUTB based on the amplified levels.

As described above, the sense amplifier circuit 1 in accordance with an embodiment may start the sense amplification operation when a change in the level of the input signals IN and INB are sensed. That is, although the sense control signal EN indicative of the sense amplification operation is received, the sense amplifier circuit 1 does not start the sense amplification operation immediately. After a change in the level of the input signals IN and INB is sensed, the sense amplifier circuit 1 starts the sense amplification operation. Accordingly, the sense amplifier circuit 1 can amplify the input signals IN and INB stably and may generate the output signals OUT and OUTB based on the amplified signals.

Referring to FIG. 2, the sense amplifier circuit 1 can further include a cut-off unit 170. The cut-off unit 170 may receive the sense control signal EN. In an embodiment, the cut-off unit 170 may receive an inversion signal ENB of the sense control signal EN. When the sense control signal EN is disabled, the sense voltage can be prevented from being supplied to the sense unit 150. When the sense control signal EN is not supplied, that is, the sense amplification operation is not performed, the cut-off unit 170 can prevent the sense voltage from being supplied to the sense unit 150. When the sense control signal EN is enabled, the cut-off unit 170 does not prevent the sense voltage from being supplied to the sense unit 150.

Referring to FIG. 2, in an embodiment, the enable signal generation unit 110 may include first and second PMOS transistors P11 and P12, respectively. The input signal IN may be inputted to the gate of the first PMOS transistor P11, the sense control signal EN may be inputted to one of the source and drain of the first PMOS transistor P11, and the other of the source and drain of the first PMOS transistor P11 may be connected to a first node D1. The input signal INB may be inputted to the gate of the second PMOS transistor P2, the sense control signal EN may be inputted to one of the source and drain of the second PMOS transistor P2, and the other of the source and drain of the second PMOS transistor P2 may be connected to the first node D1. The enable signal SEN may be outputted from the first node D1. Accordingly, when one of the levels of the input signals IN and INB shifts to a low level, one of the first and the second PMOS transistors P1 and P2 may be turned on, so that the sense control signal EN may be supplied to the first node D1. That is, the enable signal SEN can be generated from the first node D1. In accordance with this construction, when a change in the level of the input signals IN and INB is sensed, the enable signal generation unit 110 can generate the enable signal SEN from the sense control signal EN.

In an embodiment, the sink unit 130 may include a first NMOS transistor N11. The first NMOS transistor N11 has a gate to which the enable signal SEN may be inputted, a source connected to the sense voltage, and a drain connected to a second node D2. When the enable signal SEN is enabled, the first NMOS transistor N11 may be turned on, thus supplying the sense voltage to the second node D2.

In an embodiment, the sense unit 150 may include second and third NMOS transistors N12 and N13, respectively. The input signal IN may be inputted to the gate of the second NMOS transistor N12, one of the source and drain of the second NMOS transistor N12 may be connected to the second node D2, and the output signal OUTB may be outputted through the other of the source and drain of the second NMOS transistor N12. The input signal INB may be inputted to the gate of the third NMOS transistor N13, one of the source and drain of the third NMOS transistor N13 may be connected to the second node D2, and the output signal OUT may be outputted through the other of the source and drain of the third NMOS transistor N13. When the input signal IN is in the first level, the second NMOS transistor N12 may be turned on, thus generating the output signal OUTB from the sense voltage. When the input signal INB is in the first level, the third NMOS transistor N13 may be turned on, thus generating the output signal OUT from the sense voltage.

In an embodiment, the cut-off unit 170 may include a fourth NMOS transistor N14. The inversion signal ENB of the sense control signal EN may be inputted to the gate of the fourth NMOS transistor N14, the sense voltage may be inputted to one of the source and drain of the fourth NMOS transistor N14, and the other of the source and drain of the fourth NMOS transistor N14 may be connected to the first node D1. When the sense control signal EN is disabled, the fourth NMOS transistor N14 is turned on in response to the inversion signal ENB of the sense control signal EN, thus supplying the sense voltage to the first node D1. Since the sense voltage may be the ground voltage VSS, the first NMOS transistor N11 which may receive the ground voltage VSS from the first node D1 may be turned off. When the first NMOS transistor N11 is turned off, the sense voltage may not be supplied to the sense unit 130. In contrast, when the sense control signal EN is enabled, the fourth NMOS transistor N14 may be turned off, so that the sense voltage may not be supplied to the first node D1. Accordingly, the level of the first node D1 can shift in response to the enable signal EN.

Figure 3:
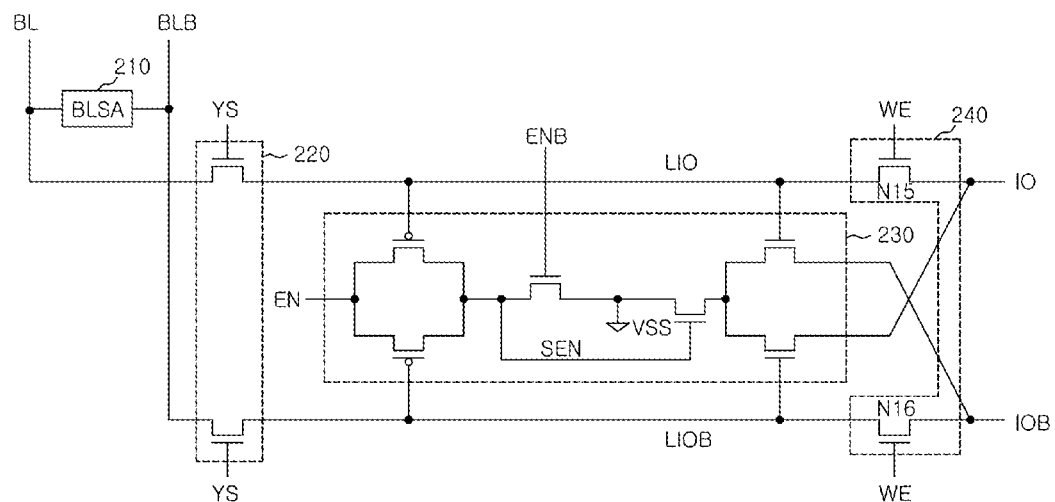
FIG. 3 is a diagram illustrating a construction of a semiconductor device in accordance with an embodiment.

FIG. 3 is a diagram illustrating a construction of a semiconductor device in accordance with an embodiment. Referring to FIG. 3, the semiconductor device 2 may include a bit line sense amplifier (BLSA) 210, a column switch 220, and a sense amplifier unit 230. The semiconductor device 2 further may include a pair of bit lines BL and BLB, a pair of first data I/O lines LIO and LIOB, and a pair of second data I/O lines IO and IOB.

The BLSA 210 may amplify data that is stored in a memory cell and then loaded onto the bit line BL. The column switch 220 may transmit the amplified data to the pair of first data I/O lines LIO and LIOB in response to a column select signal YS. The sense amplifier unit 230 may have substantially the same construction as the sense amplifier circuit 1 of FIG. 2. The sense amplifier unit 230 may sense a change in the level of data received from the column switch 220 and may perform an amplification operation based on a result of the sensing. The sense amplifier unit 230 may be enabled when the levels of the first data I/O lines LIO and LIOB are changed by the data received from the column switch 220. When the sense amplifier unit 230 is enabled, the sense amplifier unit 230 may generate output signals by amplifying the received data. The output signals may be transmitted through the pair of second data I/O lines IO and IO.

Additionally, the pair of first data I/O lines LIO and LIOB can be precharged to the first level. If data stored in a memory cell has the first level, amplified data of the first level may be supplied to the first data I/O line LIO and amplified data of the second level may be supplied to the first data I/O line LIOB. Accordingly, the first data I/O line LIO can maintain the precharged first level, and the level of the first data I/O line LIOB can shift from the first level to the second level. In contrast, if data stored in a memory cell is at the second level, amplified data of the second level may be supplied to the first data I/O line LIO and amplified data of the first level may be sent to the first data I/O line LIOB. Accordingly, the level of the first data I/O line LIO can shift from the first level to the second level, and the first data I/O line LIOB can maintain the precharged first level.

A column select signal VS that turns on the column switch 220 and an sense control signal EN that instructs the sense amplification operation of the sense amplifier unit 230 can be generated from the same command signal. For example, the column select signal YS and the sense control signal EN can be generated in response to a read command that instructs a read operation on the semiconductor device 2. Furthermore, in general, the column select signal YS and the sense control signal EN may be enabled substantially at the same point in time. Accordingly, when the read operation on the semiconductor device 2 is performed, a point in time at which data amplified by the BLSA 210 is supplied to the pair of first data I/O lines LIO and LIOB may be substantially identical with a point in time at which the sense amplifier unit 230 senses and amplifies the level of the pair of first data I/O lines LIO and LIOB. Accordingly, if points in time at which the two signals VS and EN are not identical with each other owing to a change in the process, voltage, and temperature, the sense amplifier unit 230 does not generate the output signals. For example, when the sense control signal EN is enabled earlier than the column select signal YS, the sense amplifier unit 230 can be operated before amplified data is supplied to the pair of first data I/O lines LIO and LIOB, with the result that erroneous output signals can be generated. In accordance with an embodiment, however, although the sense amplifier unit 230 may receive the sense control signal EN, the semiconductor device 2 may be configured not to operate when a change in the voltage level of the pair of first data I/O lines LIO and LIOB is not detected. When a change in the voltage level of the pair of first data I/O lines LIO and LIOB is detected, the sense amplifier unit 230 in accordance with an embodiment may generate the enable signal SEN from the sense control signal EN and may perform the sense amplification operation in response to the enable signal SEN. That is, although points in time at which the column select signal YS and the sense control signal EN are changed because skew occurs between the column select signal VS and the sense control signal EN, the sense amplifier unit 230 can perform an amplification operation on data transmitted to the pair of first data I/O lines LIO and LIOB at a point in time at which data amplified by the BLSA 210 has always been sufficiently supplied to the pair of first data I/O lines LIO and LIOB. The semiconductor device 2 in accordance with an embodiment can generate the output signals precisely and stably because it can control a point in time at which the sense amplifier unit 230 may be operated.

Referring to FIG. 3, the semiconductor device 2 in accordance with an embodiment further may include a write control unit 240. The write control unit 240 may supply data, transmitted through the pair of second data I/O lines IO and IOB, to the pair of first data I/O lines LIO and LIOB. The write control unit 240 may transmit the data of the pair of second data I/O lines IO and IOB to the pair of first data I/O lines LIO and LIOB in response to a write enable signal WE generated from a write command. The data transmitted to the pair of first data I/O lines LIO and LIOB can be amplified by the BLSA 210 and stored in a memory cell.

The write control unit 240 may include fifth and sixth NMOS transistors N15 and N16, respectively. The write enable signal WE may be inputted to the gate of the fifth NMOS transistor N15, one of the source and drain of the fifth NMOS transistor N15 may be connected to the first data I/O line LIO, and the other of the source and drain of the fifth NMOS transistor N15 may be connected to the second data I/O line IO. The write enable signal WE may be inputted to the gate of the sixth NMOS transistor N16, one of the source and drain of the sixth NMOS transistor N16 may be connected to the first data I/O line LIOB, and the other of the source and drain of the sixth NMOS transistor N16 may be connected to the second data I/O line IOB.

Figure 4:
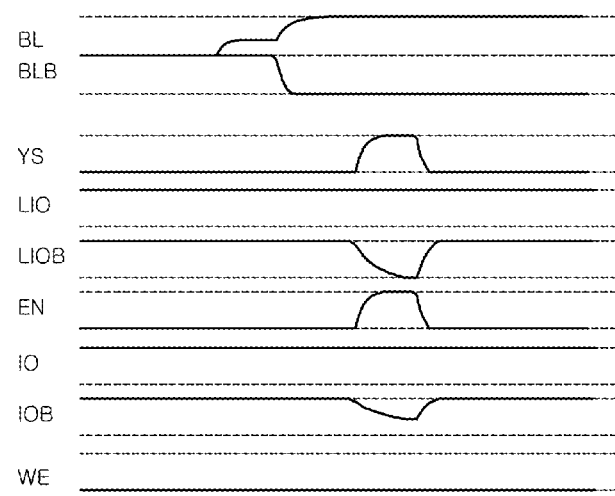
FIG. 4 is a diagram illustrating operation timing when the semiconductor device of FIG. 3 performs a read operation.
Figure 5:
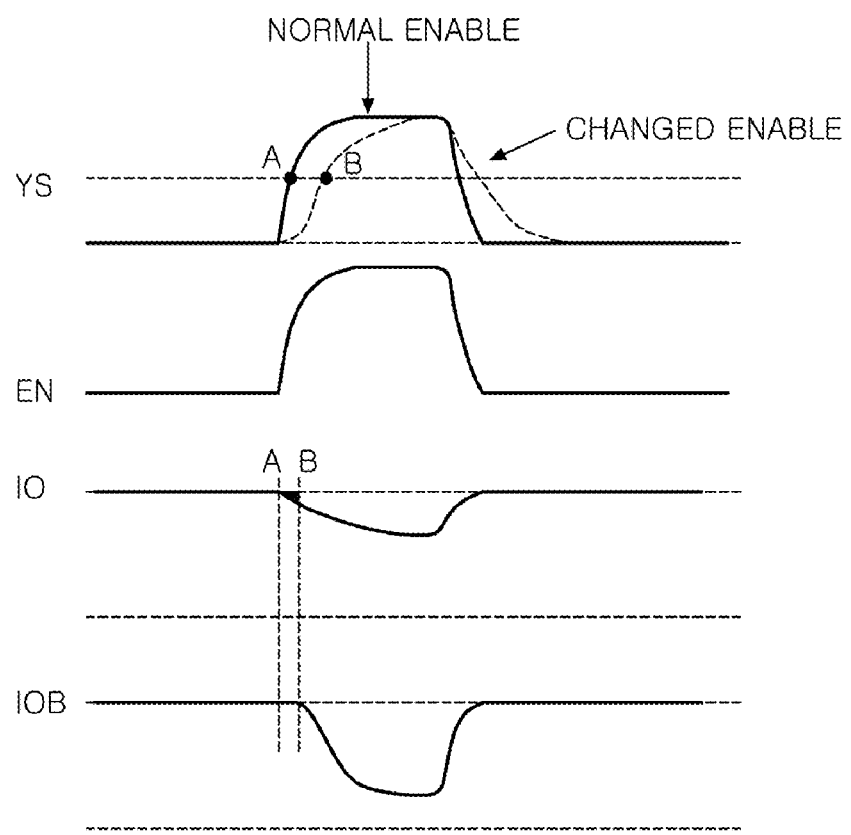
FIG. 5 is a timing diagram illustrating an abnormal amplification operation which may occur in the prior art.
Figure 6:
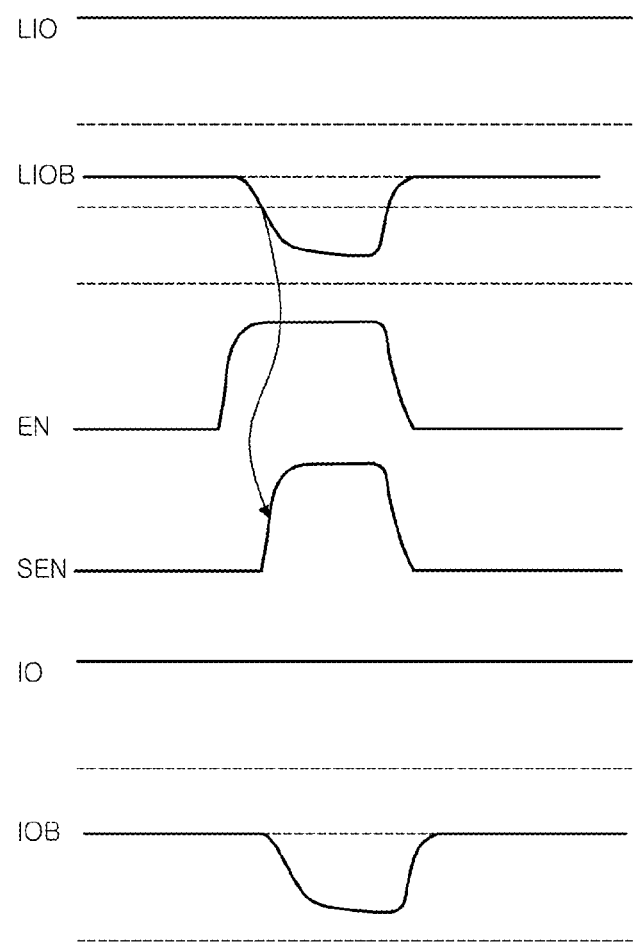
FIG. 6 is a timing diagram illustrating the improved operation of the sense amplifier circuit in accordance with an embodiment.

FIG. 4 is a diagram illustrating operation timing when the semiconductor device of FIG. 3 may perform a read operation. FIG. 5 is a timing diagram illustrating an abnormal amplification operation which can occur in the prior art. FIG. 6 is a timing diagram illustrating the improved operation of the sense amplifier circuit in accordance with an embodiment. The operation of the semiconductor device in accordance with various embodiments is described below with reference to FIGS. 4 to 6.

When a read command (not illustrated) is supplied, charge sharing may be generated in a pair of bit lines BL and BLB and a difference in the voltage of the bit line BL and the bit line bar BLB occurs because of the BLSA 210. FIG. 4 illustrates the case where data of a high level may be outputted. The write enable signal WE generated in response to a write command has been disabled because the operation is a read operation. The pair of first data I/O lines LIO and LIOB and the pair of second data I/O lines IO and IOB have been precharged to voltage of a high level. After some time elapses since the read command is supplied, the column select signal YS and the sense control signal EN are enabled. When the column select signal YS is enabled, the data of the pair of bit lines BL and BLB may be supplied to the pair of first data I/O lines LIO and LIOB. When the sense control signal EN is enabled, the sense amplifier unit 230 may start amplifying the data of the first data I/O line LIO and LIOB. The amplified data, that is, output signals, may be sent to the second data I/O line IO and IOB, and thus the data may be transmitted from a memory cell to the second data I/O line IO and IOB.

If the column select signal VS and the sense control signal EN are enabled and the column select signal YS and the sense control signal EN are changed by a process, voltage, and temperature (PVT) variation and other operation and/or environmental factors, data can not be precisely amplified. FIG. 5 illustrates the case where the column select signal YS may be enabled later than the sense control signal EN. If the column select signal VS is enabled at a point in time B later than a normal point in time A, the sense amplifier unit may start amplifying the data of the pair of first data I/O lines LIO and LIOB before data amplified by the BLSA 210 is supplied to the first data I/O line LIO and LIOB. In this case, if transistors that form the sense amplifier unit do not have constant threshold voltages, the voltage of the first data I/O line LIO can drop although the pair of first data I/O lines LIO and LIOB has been precharged to a high level. The sense amplifier unit can recognize the voltage drop of the first data I/O line LIO as data of a low level and recognize the data of the first data I/O line LIOB as being a high level. Accordingly, an output signal IO having a level reversed from a desired level of output data can be generated. That is, there is a problem in that data outputted from a memory cell and then amplified has a high level, but the output signal IO of a low level is generated. In FIG. 5, the output signal IO is illustrated as having dropped to a low level for some sections although it has to maintain a high level.

The semiconductor device 2 in accordance with an embodiment may include the sense amplifier unit 230 capable of improving the problem. When there is a change in the voltage level of the pair of first data I/O lines LIO and LIOB, the sense amplifier unit 230 may generate the enable signal SEN and may perform an amplification operation even if the sense control signal EN is enabled. A change in the voltage level of the pair of first data I/O lines LIO and LIOB may mean that data amplified by the BLSA 210 has been supplied to the pair of first data I/O lines LIO and LIOB. That is, the sense amplifier unit 230 may be configured to perform the amplification operation after the data amplified by the column switch 220 is supplied to the pair of first data I/O lines LIO and LIOB. As in FIG. 6, the enable signal SEN is not enabled although the sense control signal EN is enabled, but the enable signal SEN is enabled when the voltage level of the first data I/O line LIOB shifts to a low level. As a result, although the column select signal YS is generated after the sense control signal EN is generated, the sense amplifier unit 230 can perform an amplification operation always after the column select signal YS is generated. Accordingly, an abnormal amplification operation, such as that illustrated in FIG. 5, is not generated, and an output signal can be generated precisely and stably.

While various embodiments have been described above, it will be understood to those skilled in the art that the embodiments described are by way of example only. Accordingly, the sense amplifier circuit and the semiconductor device using the same described herein should not be limited based on the described embodiments.

What is claimed is:

1. A semiconductor device, comprising:
   a bit line sense amplifier configured to amplify data of a memory cell;
   a column switch configured to transmit the amplified data to first data I/O lines in response to a column select signal; and
   a sense amplifier unit configured to generate output signals by amplifying the transmitted data and output the output signals to second data I/O lines in response to an enable signal,
   wherein the sense amplifier unit comprises an enable signal generation unit configured to sense a change in a voltage level of the transmitted data and generate the enable signal from a sense control signal according to a result of the sensing, a sink unit configured to supply a sense voltage in response to the enable signal, and a sense unit configured to generate the output signals in response to the sense voltage and the transmitted data.

2. The semiconductor device according to claim 1, wherein:
   the column select signal and the sense control signal are generated from an identical command signal, and
   a point in time at which the column select signal is enabled is substantially identical with a point in time at which the sense control signal is enabled.

3. The semiconductor device according to claim 1, wherein the sense amplifier unit is enabled when the voltage level of the transmitted data shifts from a first level to a second level.

4. The semiconductor device according to claim 3, wherein the first data I/O lines are precharged to the first level.

5. The semiconductor device according to claim 1, wherein the sense amplifier unit is configured to be enabled only when both of the column select signal and the sense control signal are enabled.

* * * * *